United States Patent
Suzuki et al.

(10) Patent No.: US 7,486,491 B2
(45) Date of Patent: Feb. 3, 2009

(54) GROUND DETECTOR AND DC-AC INVERTER FOR VEHICLES

(75) Inventors: Sadanori Suzuki, Kariya (JP); Kiminori Ozaki, Kariya (JP)

(73) Assignee: Kabushiki Kaisha Toyota Jidoshokki, Kariya-Shi (JP)

( * ) Notice: Subject to any disclaimer, the term of this patent is extended or adjusted under 35 U.S.C. 154(b) by 317 days.

(21) Appl. No.: 11/527,366

(22) Filed: Sep. 25, 2006

(65) Prior Publication Data
US 2007/0268636 A1 Nov. 22, 2007

(30) Foreign Application Priority Data
May 22, 2006 (JP) ............... 2006-142123

(51) Int. Cl.
*H02H 3/00* (2006.01)
(52) U.S. Cl. .............. 361/42; 361/38; 361/58; 318/800; 318/795; 318/814; 315/77; 315/241 R; 315/224
(58) Field of Classification Search ........... 361/38, 361/42, 46, 51, 58; 318/533, 795, 800, 801, 318/814; 315/77, 80, 241 R, 240, 291, 209 R, 315/276, 224
See application file for complete search history.

(56) References Cited

U.S. PATENT DOCUMENTS 4,525,665 A * 6/1985 Smalley ................ 324/522
4,952,848 A * 8/1990 Erhardt ................ 315/307
2007/0188948 A1* 8/2007 Morita ................ 361/42

FOREIGN PATENT DOCUMENTS

| EP | 0 185 887 A2 | 7/1986 |
| JP | 63-182634 | 11/1988 |
| JP | 05-244701 | 9/1993 |

OTHER PUBLICATIONS

European Search Report dated Oct. 1, 2007 issued by European Patent Office for application No. 06120911.0-1524.

* cited by examiner

*Primary Examiner*—Haissa Philogene
(74) *Attorney, Agent, or Firm*—Morgan & Finnegan, LLP

(57) ABSTRACT

A ground detector includes a pair of lines, a first series circuit, a reference portion, a second series circuit, and a detection point. The first series circuit connects the lines to each other. The first series circuit includes first capacitors that are connected in series. The reference portion is connected to a portion of the first series circuit between two of the first capacitors for DC insulating the lines from the reference portion. The second series circuit connects the lines to each other. The second series circuit includes second capacitors that are connected in series. The detecting point is provided in the second series circuit. Each of the lines is connected to the detecting point through at least corresponding one of the second capacitors. The ground detector detects a change of impedance between the lines and the reference portion based on a change of potential of the detecting point with respect to potential of the reference portion.

15 Claims, 6 Drawing Sheets

GROUND DETECTOR AND DC-AC INVERTER FOR VEHICLES

BACKGROUND OF THE INVENTION

The present invention relates to a ground detector and a DC-AC inverter for vehicles, and, more particularly, to a ground detector used preferably for detecting grounding of a DC-AC inverter for a vehicle and a DC-AC inverter for a vehicle including the ground detector.

Typically, a ground detector having a charging current calculating section, a grounding current calculating section, and a grounding fault determining section has been proposed as a ground detector for an inverter (see Japanese Laid-Open Utility Model Publication No. 63-182634). The charging current calculating section calculates the value of a charging current varied in correspondence with variation of the output frequency of the inverter. The grounding current calculating section calculates the value of a grounding current. The thus calculated value of the grounding current is compared with a setting value by the grounding fault determining section. The ground detector detects a zero-phase current using a coil.

Further, as a ground detection circuit that detects grounding of a feeder cable provided in an electric vehicle, a ground detection circuit including a circuit network and an impedance change detection circuit has been proposed (see Japanese Laid-Open Patent Publication No. 5-244701). The circuit network has a capacitor that interrupts direct current between the feeder cable and the vehicle. The impedance of the circuit network changes when grounding occurs. Such change of the impedance of the circuit network is detected by the impedance change detection circuit.

A DC-AC inverter for vehicles is employed in a vehicle for allowing use of an electric appliance inside the vehicle. Specifically, voltage of a battery of the vehicle is input to the DC-AC inverter. The voltage is then converted to a voltage at which the electric appliance is used (for example, a single-phase AC voltage of 100V or 120V) by a DC-AC conversion circuit. In the DC-AC inverter, a pair of AC output lines are DC insulated from the ground (GND) of the body of the vehicle. In a conventional case, when such insulation is lost, a leakage detector detects the fact.

Specifically, such detection is accomplished not when insulation between one of the two AC output lines and the vehicle body ground is lost but when insulation between both of the AC output lines and the vehicle body ground is lost. Thus, there is a demand that such detection be achieved when the insulation between one of the AC output lines and the vehicle body ground is lost, or grounding occurs.

The ground detector of Japanese Laid-Open Utility Model Publication No. 63-182634 needs a coil for detecting the zero-phase current. Since the coil is expensive and large-sized, a large-scaled peripheral circuit must be provided. Similarly, the method for detecting the change of the impedance caused by grounding described in Japanese Laid-Open Patent Publication No. 5-244701 involves a large-scaled detection circuit (which employs a micro-computer).

SUMMARY OF THE INVENTION

Accordingly, it is a first objective of the present invention to provide a ground detector that detects grounding by a simple structure for detecting a change of the potential of a detecting point. A second objective of the present invention is to provide a DC-AC inverter for a vehicle including the ground detector.

To achieve the foregoing objectives and in accordance with one aspect of the present invention, a ground detector including a pair of lines, a first series circuit, a reference portion, a second series circuit, and a detection point is provided. The first series circuit connects the lines to each other. The first series circuit includes a plurality of first capacitors that are connected in series. The reference portion is connected to a portion of the first series circuit between two of the first capacitors for DC insulating the lines from the reference portion. The second series circuit connects the lines to each other. The second series circuit includes second capacitors that are connected in series. The detecting point is provided in the second series circuit. Each of the lines is connected to the detecting point through at least corresponding one of the second capacitors. The ground detector detects a change of impedance between the lines and the reference portion based on a change of potential of the detecting point with respect to potential of the reference portion.

In accordance with another aspect of the present invention, a ground detector including a pair of lines, a series circuit, a reference portion, and a detecting point is provided. The series circuit connects the lines to each other. The series circuit includes a plurality of capacitors that are connected in series. The reference portion is connected to a portion of the series circuit between two of the first capacitors for DC insulating the lines from the reference portion. The detecting point is provided in the series circuit. Each of the lines is connected to the detecting point through at least corresponding one of the capacitors. The ground detector detects a change of impedance between the lines and the reference portion based on a change of potential of the detecting point with respect to potential of the reference portion.

According to another aspect of the present invention, a DC-AC inverter for a vehicle including any one of the ground detectors is provided. The lines are AC output lines. The reference portion is a vehicle body ground.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A first embodiment of the present invention will now be described with reference to FIGS. 1 to 3B.

Figure 1:
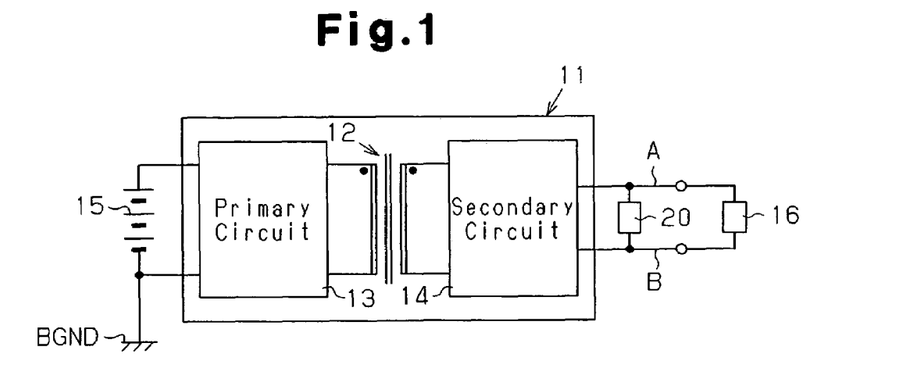
FIG. 1 is a circuit diagram representing a DC-AC inverter including a ground detector according to a first embodiment of the present invention.

As illustrated in FIG. 1, a DC-AC inverter 11 has a primary circuit 13 and a secondary circuit 14 that are insulated from each other by a transformer 12. The DC-AC inverter 11 increases voltage of a battery 15, which is a DC power supply provided in a vehicle, to DC voltage higher than the battery voltage by a DC-DC converter section. The DC voltage is then converted to AC voltage (for example, AC 100V or AC 120V) by a DC-AC inverter section. The AC voltage is supplied to a load device 16 through a pair of AC output lines A, B. The minus terminal of the battery 15 is connected to a vehicle body ground BGND, which refers to a ground of the vehicle body. A ground detector 20 is arranged between the AC output lines A, B.

The DC-DC converter section is configured by the primary circuit 13, the transformer 12, and a non-illustrated rectification circuit that forms a portion of the secondary circuit 14. When a switching element of the primary circuit 13 is switched by a non-illustrated control device, the DC voltage of the battery 15 is increased to a predetermined level. The DC-AC inverter section forms another portion of the secondary circuit 14 and includes an H-bridge circuit having four switching elements. When the switching elements of the H-bridge circuit are switched by the control device, the DC voltage is converted to the AC voltage and the AC voltage is output.

Figure 2:
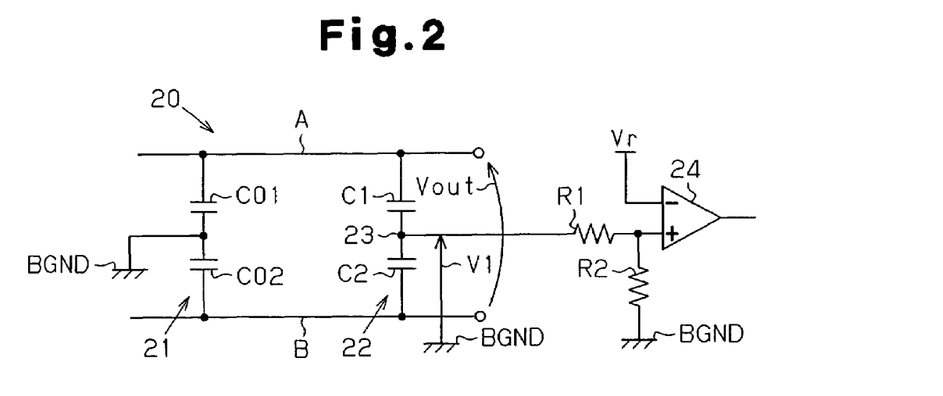
FIG. 2 is a circuit diagram representing the ground detector of FIG. 1.

As illustrated in FIG. 2, the ground detector 20 is connected to the AC output lines A, B, or a pair of lines. A first series circuit 21 including two first capacitors C01, C02, which are connected in series, is connected to and arranged between the AC output lines A, B. In other words, the first series circuit 21 connects the AC output lines A, B to each other. The connecting portion of the first capacitors C01, C02, which is a portion of the first series circuit 21 between the first capacitors C01, C02, is connected to the vehicle body ground BGND. Accordingly, the AC output lines A, B are DC insulated from the vehicle body ground BGND. The vehicle body ground BGND functions as a reference portion of the ground detector 20. The first capacitors C01, C02 have equal capacities.

If grounding is detected when one of the AC output lines A, B is completely grounded (the resistance between one of the AC output lines A, B and the vehicle body ground BGND becomes extremely small), such detection is performed regardless of the capacities of the first capacitors C01, C02. However, if grounding through resistance as small as several tens of kilo-ohms is detected, such detection depends on the capacities of the first capacitors C01, C02. If the capacity of each first capacitor C01, C02 is represented by C, the frequency of each AC output line A, B is represented by f, and the impedance between the AC output lines A, B and the vehicle body ground BGND is represented by Z, the following expression is satisfied: $Z=1/(2\pi f C)$. If, for example, the value f is 50 Hz and the value Z is 30 kΩ, the value C is calculated using the following expression.

$$C=1/(2\times 3.14\times 50\times 30000)=0.0000001061$$

That is, if the value f is 50 Hz and the value Z is 30 kΩ, the capacitor capacity C corresponding to the impedance of 30 kΩ is approximately 0.1 μF. The capacity of each first capacitor C01, C02 is set to a value sufficiently smaller than the value C in the case where the value f is 50 Hz and the Value Z is 30 kΩ, or, for example, 0.01 μF or smaller.

A second series circuit 22, which includes two second capacitors C1, C2 that are connected in series, is connected to and arranged between the AC output lines A, B. In other words, the second series circuit 22 connects the AC output lines A, B to each other. The connecting portion of the second capacitors C1, C2, which is a portion of the second series circuit 22 between the second capacitors C1, C2, is provided with a detecting point 23. In other words, each of the AC output lines A, B is connected to the detecting point 23 through the associated one of the second capacitors C1, C2. The ground detector 20 includes the AC output lines A, B, the first series circuit 21, the vehicle body ground BGND, and the detecting point 23.

The detecting point 23 is connected to a non-inverting input terminal of a comparator 24 through a resistor R1. The connecting portion of the resistor R1 and the non-inverting input terminal of the comparator 24 is connected to the vehicle body ground BGND through a resistor R2. A ground determining voltage Vr is input to the inverting input terminal of the comparator 24. The comparator 24 can be used with both positive and negative power supplies. Specifically, when grounding occurs, the detecting point 23 outputs an output voltage V1. The output voltage V1 is divided by the resistors R1, R2 and input to the non-inverting input terminal of the comparator 24 as an input voltage Vi. The ground determining voltage Vr is set to a value smaller than the peak voltage of the input voltage Vi.

Operation of the DC-AC inverter 11 and that of the ground detector 20 will hereafter be explained. When the start switch of the DC-AC inverter 11 is turned on, the switching element of the primary circuit 13 is controlled to generate AC voltage higher than the voltage of the battery 15 through a secondary coil of the transformer 12. The AC voltage is converted to DC voltage higher than the voltage of the battery 15 by the rectification circuit of the secondary circuit 14. The switching elements of the H-bridge circuit of the DC-AC inverter section are turned on and off alternately in pairs at the intervals corresponding to the frequency of a commercial alternating current (for example, 60 Hz). Accordingly, the DC voltage supplied from the rectification circuit is converted to AC voltage of 60 Hz. The AC voltage is then input to the load device 16, which is connected to the AC output lines A, B.

Figure 3A:
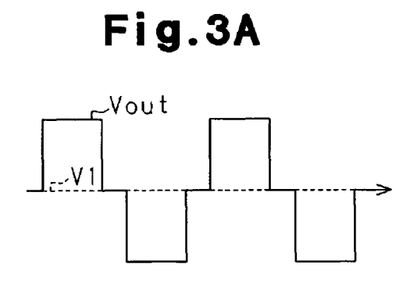
FIG. 3A is a diagram representing the waveforms of output voltage Vout and output voltage V1 in a normal state.

The ground detector 20 detects change of the impedance between the AC output lines A, B and the reference portion (the vehicle body ground BGND) in correspondence with change of the potential of the detecting point 23 with respect to the potential of the reference portion. The output voltage V1 of the detecting point 23 is divided by the resistors R1, R2 and input to the comparator 24. The comparator 24 compares the input voltage with the ground determining voltage Vr. The AC output lines A, B are DC insulated from the vehicle body ground BGND through the first capacitors C01, C02. The first capacitors C01, C02 have equal capacities and the second capacitors C1, C2 have equal capacities. Thus, as illustrated in FIG. 3A, in a normal, or non-grounded, state, the output voltage V1 of the detecting point 23 is maintained constant at 0V, regardless of change of output voltage Vout of the DC-AC inverter 11 between predetermined positive and negative peaks. In FIG. 3A, the output voltage Vout is indicated by the solid lines, while the output voltage V1 is indicated by the broken lines.

However, if the AC output line B is grounded, the potential of the reference portion (the vehicle body ground BGND) becomes equal to the potential of the AC output line B. Thus, as indicated by the broken lines of FIG. 3B, the output voltage V1 of the detecting point 23 changes in such a manner that the peak of the output voltage V1 coincides with a half of the peak of the output voltage Vout of the DC-AC inverter 11. If the AC output line A is grounded, the polarity of the output voltage V1 of the detecting point 23 becomes reversed, as indicated by the double-dotted lines of FIG. 3B.

After having been divided by the resistors R1, R2, the output voltage V1 is input to the comparator 24 as the input voltage Vi. If the input voltage Vi is higher than the ground determining voltage Vr, the comparator 24 generates a high-level output. If the input voltage Vi is lower than the ground determining voltage Vr, the comparator 24 generates a low-level output. Therefore, in the normal state, the output of the comparator 24 is maintained at the low level. However, if grounding occurs and the input voltage Vi becomes higher than the ground determining voltage Vr, the output of the comparator 24 is raised to the high level, indicating that the grounding has been detected. In the first embodiment, the comparator 24 detects grounding when the output voltage V1 of the detecting point 23 is positive. Thus, the maximum time needed for detecting the grounding coincides with the time corresponding to a single cycle of voltage change of each AC output line A, B.

The first embodiment has the following advantages.

(1) The ground detector 20 includes the first series circuit 21 and the detecting point 23. The first series circuit 21 includes the two first capacitors C01, C02 and connects the two AC output lines A, B to each other. The AC output lines A, B are DC insulated from the vehicle body ground BGND. The connecting portion of the first capacitors C01, C02 is connected to the vehicle body ground BGND, which functions as the reference portion. The detecting point 23 is connected to the AC output lines A, B through the corresponding second capacitors C1, C2. Change of the impedance between the AC output lines A, B and the reference portion is detected in correspondence with change of the potential of the detecting point 23 with respect to the potential of the reference portion. The potential of the detecting point 23 when the two AC output lines A, B are reliably DC insulated from the vehicle body ground BGND is different from the potential of the detecting point 23 when DC insulation of one of the AC output lines A, B from the vehicle body ground BGND is lost, or one of the AC output lines A, B is grounded. Grounding is thus easily detected depending whether the change of the potential of the detecting point 23 with respect to the potential of the reference portion has occurred.

(2) The ground detector 20 operates based on the change of the potential of the detecting point 23 with respect to the potential of the reference portion. Thus, grounding is detected without detecting a leakage.

(3) Since the first capacitors C01, C02 have equal capacities and the second capacitors C1, C2 have equal capacities, the output voltage V1 of the detecting point 23 becomes 0V in the normal state. The ground detector 20 is thus easy to design.

(4) The ground detector 20 includes the comparator 24, which receives the output of the detecting point 23. Thus, grounding is easily detected in correspondence with change of the potential of the detecting point 23.

(5) The capacity of each first capacitor C01, C02 is set to 0.01 µF or smaller. Thus, if any one of the AC output lines A, B is grounded through resistance of approximately 30 kΩ, such grounding is reliably detected.

A second embodiment of the present invention will hereafter be explained with reference to FIG. 4. In the second embodiment, the comparator 24 is used solely with a positive power supply, unlike the comparator 24 of the first embodiment that can be used with both positive and negative power supplies. The remainder of the second embodiment is basically identical with the corresponding portions of the first embodiment. The detailed description of these portions will thus be omitted from the following description.

Figure 4:
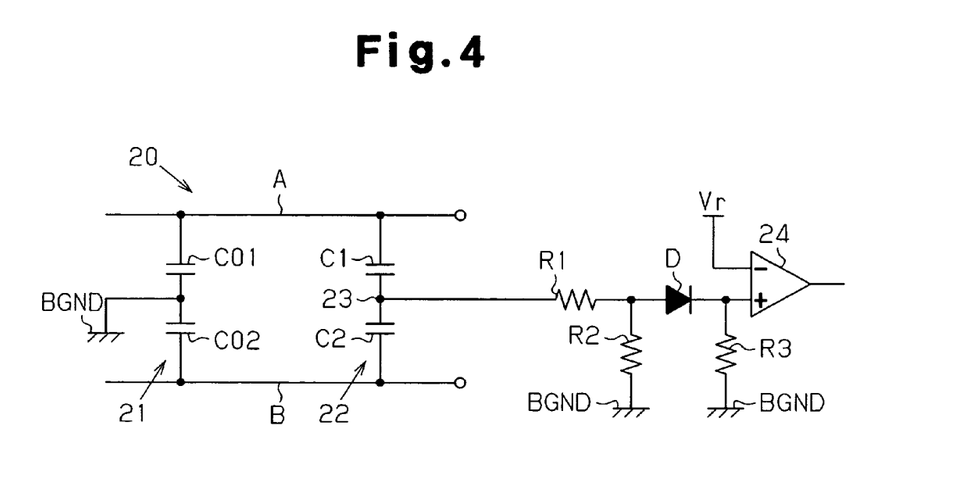
FIG. 4 is a circuit diagram representing a ground detector according to a second embodiment of the present invention.

As illustrated in FIG. 4, a diode D is connected to and arranged between the detecting point 23 and the comparator 24. In other words, the comparator 24 is connected to the detecting point 23 through the diode D. Specifically, the diode D is arranged at a position closer to the comparator 24 than the connecting portion of the resistors R1, R2. The diode D is provided in such a manner that the cathode of the diode D is arranged at the side corresponding to the comparator 24. The connecting portion of the cathode and the comparator 24 is connected to the vehicle body ground BGND through a resistor R3. If the resistance value of the resistor R3 is represented by r3 and the resistance value of the resistor R2 is r2, the following expression is satisfied: r3>>r2.

In the second embodiment, regardless of whether the output voltage V1 provided by the detecting point 23 in correspondence with the AC output of the DC-AC inverter 11 corresponds to a positive or negative potential, the diode D prevents inputting of a negative voltage to the comparator 24. This allows the comparator 24 to be employed with the single positive power supply. The resistor R3 prevents the potential between the diode D and the comparator 24 from becoming unstable.

The resistor R2 is connected to and arranged between the side of the diode D corresponding to the detecting point 23 and the vehicle body ground BGND. In other words, the connecting portion of the diode D and the detecting point 23 is connected to the vehicle body ground BGND through the resistor R2. Without the resistor R2, if the potential of the AC output line A is higher than the potential of the AC output line B when the AC output line B is completely grounded to the vehicle body ground BGND (through the resistance 0Ω), a charging current flows from the AC output line A to the AC output line B through the second capacitors C1, C2. Meanwhile, a current flows from the AC output line A to the second capacitor C1, the resistor R1, the diode D, and the resistor R3 (the potential of the AC output line B is equal to the potential of the vehicle body ground BGND). In this state, if the potential of the AC output line A is lower than the potential of the AC output line B, a charging current flows from the AC output line B to the AC output line A through the second capacitors C2, C1. However, the diode D is disconnected, thus preventing flow of a current from the vehicle body ground BGND to the second capacitor C1 through the resistor R3, the diode D, and the resistor R1.

That is, without the resistor R2, the charging current to the second capacitor C1 proceeds along different paths depending on whether the potential of the AC output line A is higher or lower than the potential of the AC output line B. Therefore, as the output voltages of the AC output lines A, B alternate, the voltages at the opposing ends of the second capacitor C1 increases (in this situation, the potential at the side of the second capacitor C1 corresponding to the AC output line A rises). The potential of the detecting point 23 thus changes in a single direction. This makes it impossible to detect grounding.

Figure 3B:
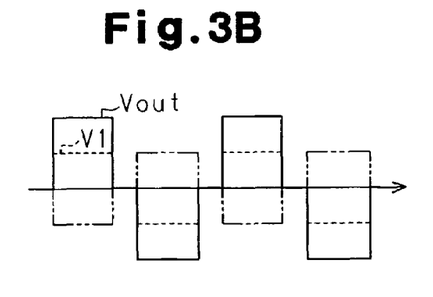
FIG. 3B is a diagram representing the waveforms of output voltage Vout and output voltage V1 in grounding.

However, by deploying the resistor R2 as illustrated in FIG. 4, the charging current flows from the vehicle body ground BGND to the second capacitor C1 regardless of whether the potential of the AC output line A is higher or lower than the potential of the AC output line B. The potential of the detecting point 23 thus varies as indicated by FIGS. 3A and 3B.

The second embodiment has the following advantages in addition to advantages equivalent to items (1) to (5) of the first embodiment.

(6) Since the comparator 24 can be employed with the single positive power supply, it is unnecessary to prepare both of positive and negative power supplies for the comparator 24. This simplifies the configuration of the ground detector 20 compared to a case in which the comparator 24 needs the positive and negative power supplies.

(7) The resistor R2 is provided between the side of the diode D corresponding to the detecting point 23 and the vehicle body ground BGND. Therefore, even with the diode D arranged between the detecting point 23 and the comparator 24, the potential of the detecting point 23 does not exceed the difference between the potential of each AC output line A, B and the potential of the vehicle body ground BGND.

A third embodiment of the present invention will hereafter be explained with reference to FIG. 5. In the third embodiment, an output of the detecting point 23 is input to a window comparator 25, unlike the first embodiment. The remainder of the third embodiment is basically identical with the corresponding portions of the first embodiment. The detailed description of these portions will thus be omitted from the following description.

Figure 5:
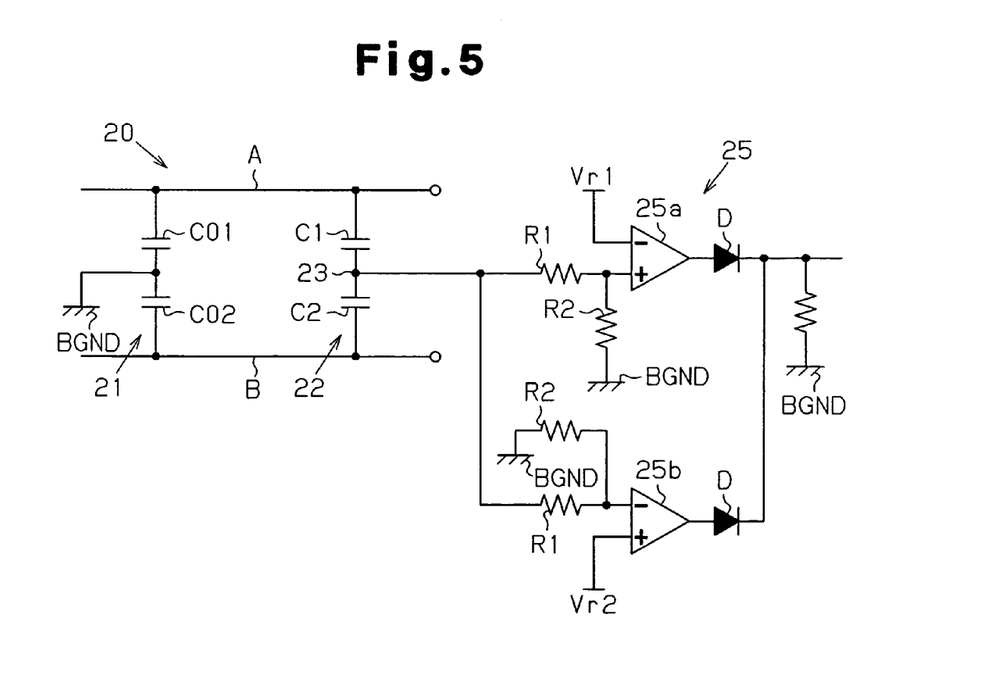
FIG. 5 is a circuit diagram representing a ground detector according to a third embodiment of the present invention.

As illustrated in FIG. 5, the window comparator 25 includes an upper limit detection comparator 25a and a lower limit detection comparator 25b. The detecting point 23 is connected to a non-inverting input terminal of the upper limit detection comparator 25a through a resistor R1 and to an inverting input terminal of the lower limit detection comparator 25b through a resistor R1. An inverting input terminal of the upper limit detection comparator 25a is connected to a ground determining voltage Vr1. A non-inverting input terminal of the lower limit detection comparator 25b is connected to a ground determining voltage Vr2. The ground determining voltage Vr1 is set to a positive value with an absolute value smaller than the absolute value of the peak voltage of the input voltage Vi. The ground determining voltage Vr2 is set to a negative value with an absolute value smaller than the absolute value of the peak voltage of the input voltage Vi. The output terminal of the upper limit detection comparator 25a and the output terminal of the lower limit detection comparator 25b are connected to each other through corresponding diodes D.

In the third embodiment, when the input voltage Vi exceeds the ground determining voltage Vr1, the upper limit detection comparator 25a outputs a high-level signal. When the input voltage Vi becomes lower than the ground determining voltage Vr2, the lower limit detection comparator 25b outputs a high-level signal. Thus, if the output voltage of the detecting point 23 is positive, grounding is detected by the upper limit detection comparator 25a. If the output voltage of the detecting point 23 is negative, grounding is detected by the lower limit detection comparator 25b. In other words, grounding is detected regardless of whether the output voltage Vout is positive or negative.

The third embodiment has the following advantage in addition to advantages equivalent to items (1) to (5) of the first embodiment.

(8) In the third embodiment, the output of the detecting point 23 is processed using the window comparator 25. Therefore, grounding is detected regardless of whether the output of the detecting point 23 is positive or negative. The maximum time from occurrence of the grounding to detection of the grounding is thus reduced to the time corresponding to a half of a single cycle of change of the AC output.

A fourth embodiment of the present invention will hereafter be explained with reference to FIGS. 6, 7A and 7B. The fourth embodiment includes two detecting points, unlike the first embodiment. The remainder of the fourth embodiment is basically identical with the corresponding portions of the first embodiment. The detailed description of these portions will thus be omitted from the following description.

Figure 6:
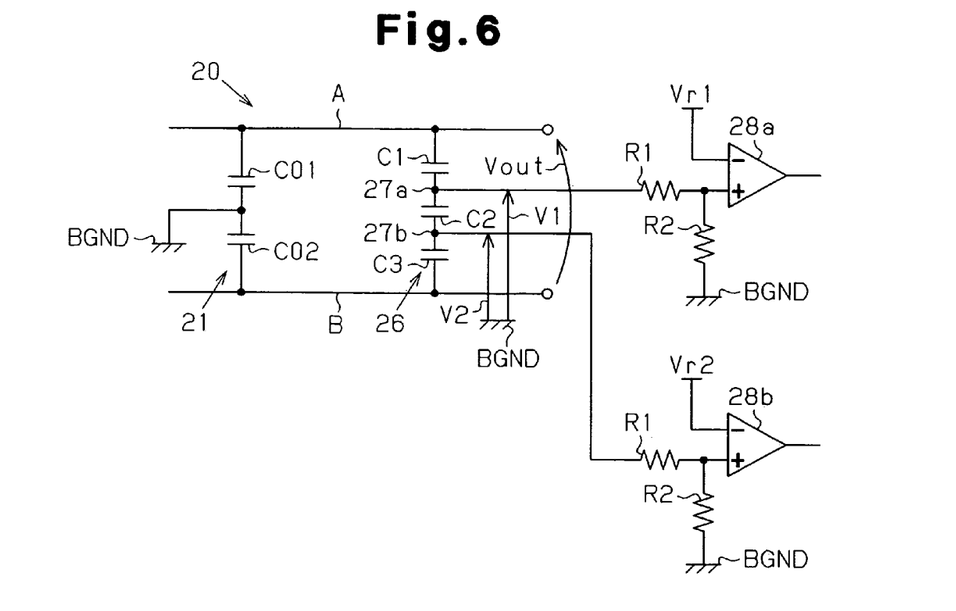
FIG. 6 is a circuit diagram representing a ground detector according to a fourth embodiment of the present invention.

As illustrated in FIG. 6, a second series circuit 26, which is a potential detection circuit, is connected to and arranged between the AC output lines A, B. In other words, the second series circuit 26 connects the AC output lines A, B to each other. The second series circuit 26 includes a second capacitor C1, a second capacitor C2, and a second capacitor C3, which are connected in series. The second capacitors C1, C2, C3 have equal capacities. The connecting portion of the second capacitors C1, C2 is provided with a first detecting point 27a. The connecting portion of the second capacitors C2, C3 is provided with a second detecting point 27b. The first detecting point 27a is connected to a non-inverting input terminal of a first comparator 28a through a resistor R1. The second detecting point 27b is connected to a non-inverting input terminal of a second comparator 28b through a resistor R1. An inverting input terminal of the first comparator 28a is connected to a ground determining voltage Vr1. An inverting input terminal of the second comparator 28b is connected to a ground determining voltage Vr2.

The first detecting point 27a generates an output voltage V1. The output voltage V1 is then divided by the resistors R1, R2 and supplied to the non-inverting input terminal of the first comparator 28a as an input voltage Vi1. The ground determining voltage Vr1 is set to a value smaller than the peak voltage of the input voltage Vi1 when the AC output line B is grounded. The second detecting point 27b generates an output voltage V2. The output voltage V2 is then divided by the resistors R1, R2 and supplied to the non-inverting input terminal of the second comparator 28b as an input voltage Vi2. The ground determining voltage Vr2 is set to a value smaller than the peak voltage of the input voltage Vi2 when the AC output line B is grounded.

Figure 7A:
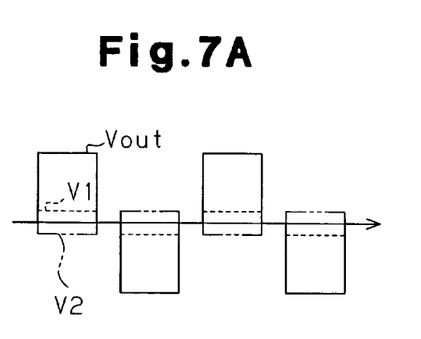
FIG. 7A is a diagram representing the waveforms of output voltage Vout and output voltages V1, V2 in a normal state.

In the fourth embodiment, in a normal state, as indicated by the broken lines of FIG. 7A, the output voltage V1 of the first detecting point 27a varies in such a manner that the peak value of the output voltage V1 coincides with one sixth of the output voltage Vout of the DC-AC inverter 11. In this state, as indicated by the double-dotted lines of FIG. 7A, the output voltage V2 of the second detecting point 27b varies in such a manner that the absolute value of the peak value of the output voltage V2 becomes equal to that of the output voltage V1 but that the polarity of the peak value of the output voltage V2 is inverted from that of the output voltage V1.

Figure 7B:
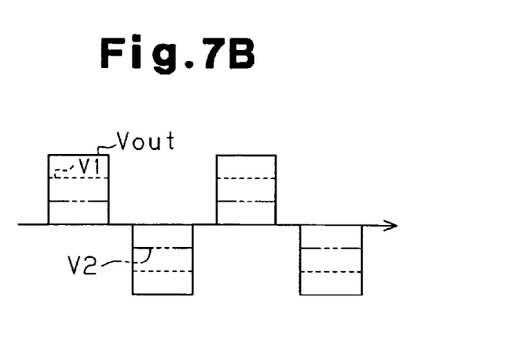
FIG. 7B is a diagram representing the waveforms of output voltage Vout and output voltages V1, V2 in grounding.

If, for example, the AC output line B is grounded through a smaller resistance value, the output voltage V1 of the first detecting point 27a changes in such a manner that the peak of the output voltage V1 coincides with two thirds of the peak of the output voltage Vout of the DC-AC inverter 11, as indicated by the broken lines of FIG. 7B. Further, as indicated by the double-dotted lines of FIG. 7B, the output voltage V2 of the second detecting point 27b changes in such a manner that the peak of the output voltage V2 coincides with one third of the peak of the output voltage Vout of the DC-AC inverter 11. If the AC output line A is grounded through a smaller resistance value, the output voltage V1 of the first detecting point 27a changes in such a manner that the peak of the output voltage V1 coincides with one third of the peak of the output voltage Vout of the DC-AC inverter 11. Meanwhile, the output voltage V2 of the second detecting point 27b changes in such a manner that the peak of the output voltage V2 coincides with two thirds of the peak of the output voltage Vout of the DC-AC inverter 11. Therefore, when the AC output line B is grounded, the output of the first comparator 28a and the output of the second comparator 28b both rise to high levels in a single cycle.

If the AC output line A is grounded, the peak of the output voltage V1 coincides with one third of the peak of the output voltage Vout. Thus, if the ground determining voltage Vr1 is set to a value greater than a value obtained by dividing a voltage corresponding to one third of the peak of the output voltage Vout, the output of the first comparator 28a does not switch to the high level and only the output of the second comparator 28b switches to the high level. Further, if the ground determining voltage Vr1 is set to a value smaller than the value obtained by dividing the voltage corresponding to one third of the peak of the output voltage Vout, the output of the first comparator 28a and the output of the second comparator 28b both rise to the high levels in a single cycle.

The fourth embodiment has the following advantages in addition to an advantage equivalent to item (5) of the first embodiment.

(9) In the second series 26, the three second capacitors C1, C2, C3 are connected in series. The connecting portion of the adjacent second capacitors C1, C2 is provided with the first detecting point 27a and the connecting portion of the adjacent capacitors C2, C3 is provided with the second detecting point 27b. In the normal state, the output voltage V1 of the first detecting point 27a and the output voltage V2 of the second detecting point 27b have equal absolute values but different polarities. However, when grounding occurs, the absolute values of the output voltages V1, V2 differ from each other. Therefore, the grounding is easily detected by detecting change of the output voltages V1, V2.

(10) The ground determining voltages Vr1, Vr2 are set to different values. Specifically, one of the ground determining voltages Vr1, Vr2 is set to a value greater than the value obtained by dividing the voltage corresponding to one third of the peak of the output voltage Vout of the DC-AC inverter 11 and smaller than the value obtained by dividing the voltage corresponding to two thirds of the peak of the output voltage Vout. The other ground determining voltage Vr1, Vr2 is set to the value smaller than the value obtained by dividing the voltage corresponding to one third of the peak of the output voltage Vout of the DC-AC inverter 11. The outputs of the first and second comparators 28a, 28b when the AC output line A is grounded are different from the outputs of the first and second comparators 28a, 28b when the AC output line B is grounded. This allows determination of whether the AC output line A or the AC output line B is grounded.

A fifth embodiment of the present invention will hereafter be explained with reference to FIG. 8. In the fifth embodiment, the outputs of the first and second detecting points 27a, 27b are input to the non-inverting input terminal of the single comparator 24, unlike the fourth embodiment. The remainder of the fifth embodiment is basically identical with the corresponding portions of the fourth embodiment. The detailed description of these portions will thus be omitted from the following description.

Figure 8:
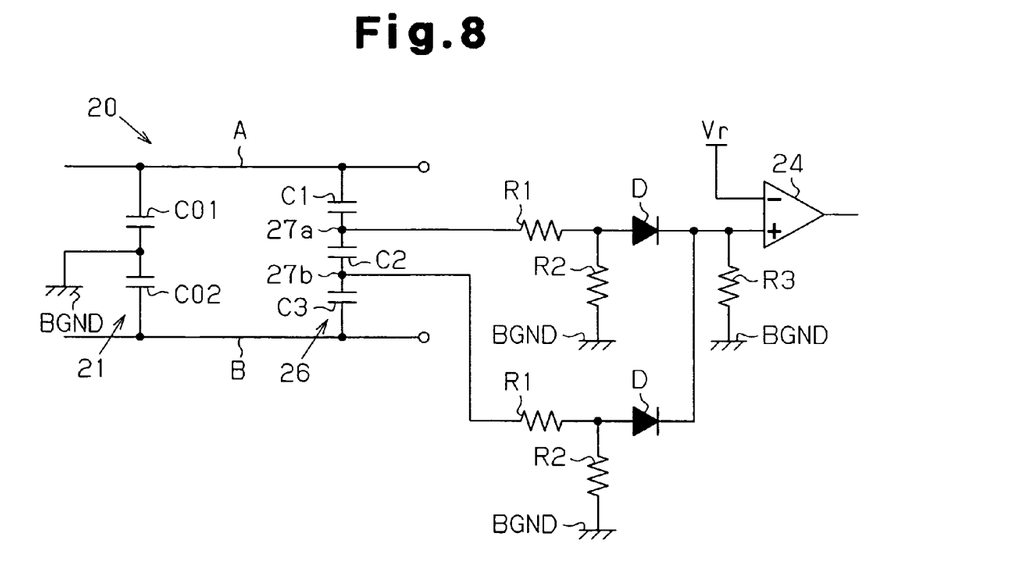
FIG. 8 is a circuit diagram representing a ground detector according to a fifth embodiment of the present invention.

As illustrated in FIG. 8, the first and second detecting points 27a, 27b are connected to the non-inverting input terminal of the comparator 24 through corresponding resistors R1 and diodes D. The connecting portion of the diodes D and the non-inverting input terminal of the comparator 24 is connected to the vehicle body ground BGND through a resistor R3. The connection states of the resistors R2 are the same as that of the second embodiment. The relationship between the resistance value of each resistor R2 and that of the resistor R3 is the same as that of the second embodiment.

In the fifth embodiment, the outputs of the first and second detecting points 27a, 27b vary in the same manner as those of the fourth embodiment. However, in the fifth embodiment, the outputs of the first and second detecting points 27a, 27b are input to the comparator 24 through the corresponding diodes D. This prevents the comparator 24 from receiving a negative voltage. Thus, even though the first detecting point 27a and the second detecting point 27b generate the equal output voltages V1, V2 when grounding occurs, only the positive voltage of the output voltages V1, V2 of FIG. 7B is input to the comparator 24.

The fifth embodiment has the following advantages in addition to advantages equivalent to item (5) of the first embodiment and item (9) of the fourth embodiment.

(11) Since the outputs of the first and second detecting points 27a, 27b are input to the comparator 24 through the corresponding diodes D, the comparator 24 can be employed with a single positive power supply.

(12) The resistors R2 are each arranged between the side of the diode D corresponding to the associated detecting point 27a, 27b and the vehicle body ground BGND. In other words, each of the connecting portions of the diodes D and the associated detecting points 27a, 27b is connected to the vehicle body ground BGND through the resistor R2. Thus, even with the diodes D provided between the corresponding detecting points 27a, 27b and the comparator 24, the potential of each detecting point 27a, 27b does not exceed the difference between the potential of the vehicle body ground BGND and the potential of each AC output line A, B.

(13) The maximum time needed for grounding detection is reduced to the time corresponding to a half of a cycle of the AC output.

A sixth embodiment of the present invention will hereafter be explained with reference to FIGS. 9, 10A and 10B. In the sixth embodiment, first capacitors and second capacitors form a single series circuit, unlike the illustrated embodiments. In other words, in the first to fifth embodiments, the first series circuit 21 and the second series circuit 22, 26 having the detecting point(s) are separately provided between the AC output lines A, B. However, in the sixth embodiment, detecting points are formed in the first series circuit.

Figure 9:
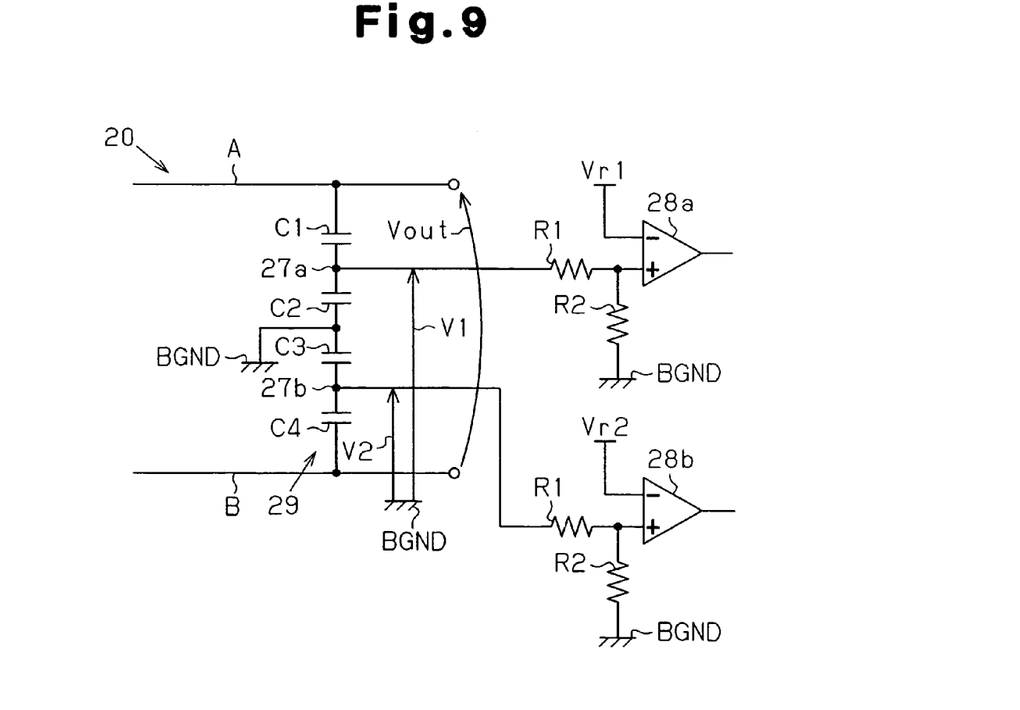
FIG. 9 is a circuit diagram representing a ground detector according to a sixth embodiment of the present invention.

As illustrated in FIG. 9, a series circuit 29, which includes four capacitors C1, C2, C3, C4 that are connected in series, is connected to and arranged between the AC output lines A, B. In other words, the series circuit 29 connects the AC output lines A, B to each other. The capacitors C1, C2, C3, C4 have equal capacities. The midpoint of the series circuit 29 is connected to the vehicle body ground BGND and functions as the reference portion. In other words, the vehicle body ground BGND is connected to the connecting portion of the capacitors C2, C3.

The connecting portion of the capacitors C1, C2 is provided with a first detecting point 27a. The connecting portion of the capacitors C3, C4 is provided with a second detecting point 27b. The first detecting point 27a is connected to a non-inverting input terminal of a first comparator 28a through a resistor R1. The second detecting point 27b is connected to a non-inverting input terminal of a second comparator 28b through a resistor R1. An inverting input terminal of the first comparator 28a and an inverting input terminal of the second comparator 28b are connected to a ground determining voltage Vr1 and a ground determining voltage Vr2, respectively.

Each of the ground determining voltages Vr1, Vr2 is set to a value smaller than one fourth of the value obtained by dividing the peak of the output voltage Vout of the DC-AC inverter 11 through the resistors R1, R2.

Figure 10A:
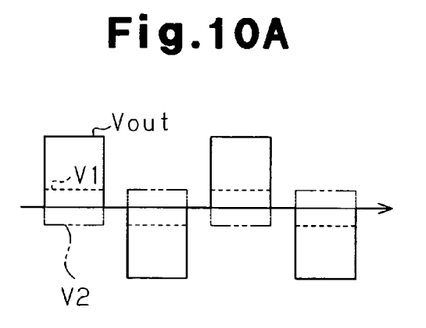
FIG. 10A is a diagram representing the waveforms of output voltage Vout and output voltages V1, V2 in a normal state.

In the ground detector 20 of the sixth embodiment, in a normal state, as indicated by the broken lines of FIG. 10A, the output voltage V1 of the first detecting point 27a varies in such a manner that the peak value of the output voltage V1 coincides with one fourth of the output voltage Vout of the DC-AC inverter 11. In this state, as indicated by the double-dotted lines of FIG. 10A, the output voltage V2 of the second detecting point 27b varies in such a manner that the absolute value of the peak value of the output voltage V2 becomes equal to that of the output voltage V1 but that the polarity of the peak value of the output voltage V2 is inverted from that of the output voltage V1.

Figure 10B:
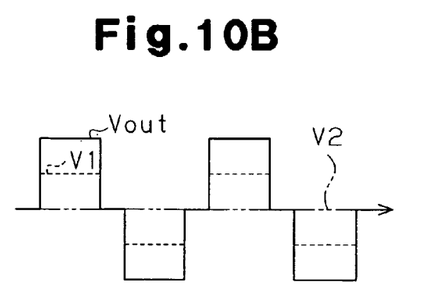
FIG. 10B is a diagram representing the waveforms of output voltage Vout and output voltages V1, V2 in grounding.

If, for example, the AC output line B is grounded through a smaller resistance value, the output voltage V1 of the first detecting point 27a changes in such a manner that the peak of the output voltage V1 coincides with a half of the peak of the output voltage Vout of the DC-AC inverter 11, as indicated by the broken lines of FIG. 10B. Meanwhile, as indicated by the double-dotted lines of FIG. 10B, the peak of the output voltage V2 of the second detecting point 27b becomes zero volts. If the AC output line A is grounded through a smaller resistance value, the peak of the output voltage V1 of the first detecting point 27a becomes zero volts. Meanwhile, the output voltage V2 of the second detecting point 27b changes in such a manner that the peak of the output voltage V2 coincides with a half of the peak of the output voltage Vout of the DC-AC inverter 11.

Therefore, in the normal state, the output of the first comparator 28a and the output of the second comparator 28b alternately switch to a high level in a single cycle. If, for example, the AC output line B is grounded, the output of the first comparator 28a is switched to the high level for a predetermined time in a single cycle while the output of the second comparator 28b is maintained at a low level. Further, if the AC output line A is grounded, the output of the second comparator 28b is switched to the high level for a predetermined time in a single cycle while the output of the first comparator 28a is maintained at a low level.

The sixth embodiment has the following advantages.

(14) The sixth embodiment includes the first and second detecting points 27a, 27b. In the normal state, the output voltage V1 of the first detecting point 27a and the output voltage V2 of the second detecting point 27b have equal absolute values but different polarities. However, in grounding, the absolute values of the output voltages V1, V2 differ from each other. Therefore, the grounding is easily detected by detecting change of the output voltages V1, V2.

(15) In the sixth embodiment, each of the ground determining voltages Vr1, Vr2 for the first and second comparators 28a, 28b is set in a predetermined range. This allows determination of whether the AC output line A or the AC output line B is grounded.

Figure 11:
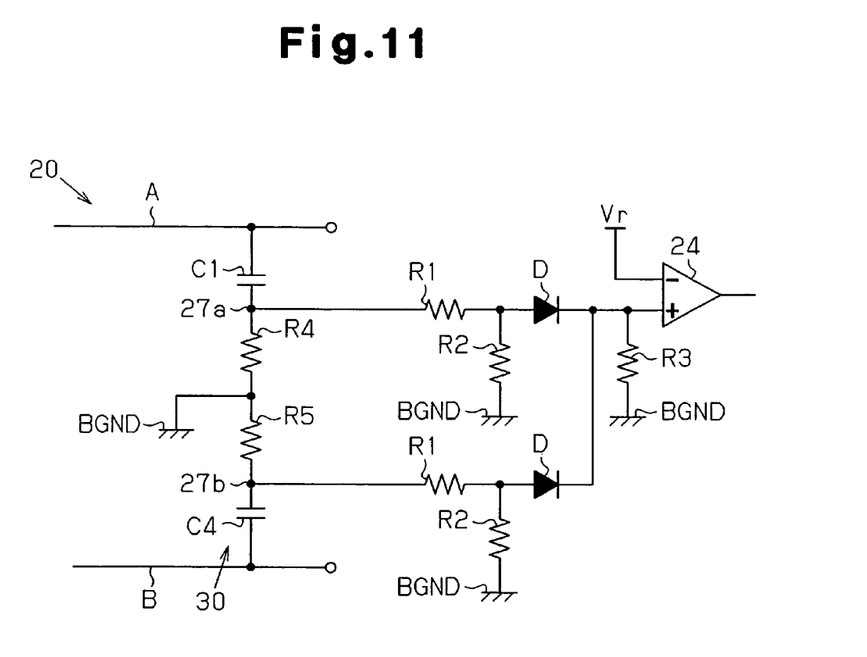
FIG. 11 is a circuit diagram representing a ground detector according to a seventh embodiment of the present invention.

A seventh embodiment of the present invention will hereafter be explained with reference to FIG. 11. In the seventh embodiment, a resistor R4 and a resistor R5 are arranged between the two AC output lines A, B instead of the capacitor C2, C3, unlike the sixth embodiment in which the four capacitors C1, C2, C3, C4 are connected in series. Specifically, a series circuit 30 is connected to and arranged between the AC output lines A, B. In other words, the series circuit 30 connects the AC output lines A, B to each other. The series circuit 30 includes two capacitors C1, C4 and two resistors R4, R5. The capacitor C1, the resistor R4, the resistor R5, and the capacitor C4 are connected in series and aligned in this order. The connecting portion of the resistors R4, R5 is connected to the vehicle body ground BGND, which functions as the reference portion. The connecting portion of the capacitor C1 and the resistor R4 is provided with a first detecting point 27a. The connecting portion of the capacitor C4 and the resistor R5 is provided with a second detecting point 27b. That is, like the sixth embodiment, the detecting points 27a, 27b are provided in the series circuit 30.

The first and second detecting points 27a, 27b are connected to the non-inverting input terminal of the comparator 24 through corresponding resistors R1 and diodes D. The connecting portion of the diodes D and the non-inverting input terminal of the comparator 24 is connected to the vehicle body ground BGND through a resistor R3. A ground determining voltage Vr is input to an inverting input terminal of the comparator 24. The comparator 24 is employed with a single positive power supply.

In the seventh embodiment, the voltage between the vehicle body ground BGND, or the reference portion, and each AC output line A, B is supplied to the corresponding capacitor C1, C4 and the associated resistor R4, R5. As the capacity of each capacitor C1, C4, which is connected to the reference portion, decreases, impedance increases, thus improving grounding detection sensitivity. As long as the resistors R4, R5 are connected together, the voltage resistance of each capacitor C1, C4 can be reduced by determining the resistance value of each resistor R4, R5 in such a manner as to maximize the level of the voltage received by the resistor R4, R5. However, in the series circuit 29 of the sixth embodiment in which only the capacitors C1, C2, C3, C4 are connected in series, if the grounding detection sensitivity is increased by decreasing the capacity of the capacitor C2, C3 connected to the reference portion, the voltage resistance of each of the other capacitors C1, C4 must be increased. This enlarges the series circuit 30.

The seventh embodiment has the following advantages.

(16) The output of the comparator 24 in the normal state differs from the output of the comparator 24 in grounding. This allows easy detection of the grounding.

(17) In the seventh embodiment, the series circuit 30 has the capacitors C1, C4, which insulate the AC output lines A, B from the vehicle body ground BGND, and the first and second detecting points 27a, 27b. Each of the detecting points 27a, 27b is connected to the corresponding one of the AC output lines A, B through the associated one of the capacitors C1, C4. In the series circuit 30, not only the capacitors C1, C4 but also the resistors R4, R5 are connected in series. Therefore, each of the capacitors C1, C4 may be formed by a capacitor exhibiting decreased voltage resistance. The series circuit 30 thus becomes smaller in size. Further, grounding detection sensitivity can be improved by increasing impedance by reducing the capacity of each capacitor C1, C4.

The present invention is not restricted to the above-described embodiments but may be embodied in the following modified forms.

Figure 12A:
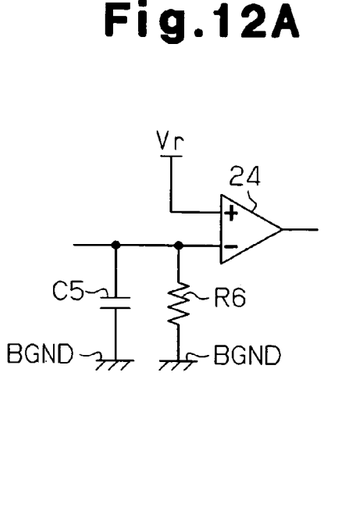
FIGS. 12A and 12B are circuit diagrams representing portions of ground detectors of other different embodiments.

In each of the illustrated embodiments, a peak hold circuit may be arranged at an input side of the comparator 24 or the like. For example, as illustrated in FIG. 12A, a circuit in which a capacitor C5 and a resistor R6 are connected in parallel with respect to the vehicle body ground BGND may be employed as the peak hold circuit. It is preferred that a diode be connected to the comparator 24 upstream from the connecting portion of the capacitor C5 and the inverting input terminal of the comparator 24 in such a manner that the cathode of the diode is arranged at the side corresponding to the comparator 24. Specifically, unless the input voltage Vi is input to the comparator 24 through the diode D as in the cases of FIG. 4 or 8, it is preferable to provide the diode D. In addition, the resistor R6 may be omitted. In the ground detector 20, the potential of the detecting point 23 changes in correspondence with the output voltage Vout of the DC-AC inverter 11 when one of the AC output lines A, B is grounded. Thus, even after having exceeded the ground determining voltage Vr, indicating that grounding has been detected, the input voltage Vi to the comparator 24 periodically becomes lower than the ground determining voltage Vr, canceling the detection. However, through peak holding, the detection of the grounding is maintained once such detection is achieved, which is preferable. The structure of the peak hold circuit is not restricted to the structure of FIG. 12A employing the capacitor C5 but may be, for example, a latch circuit. Nonetheless, the detection of grounding is maintained more easily if the capacitor C5 is included.

Figure 12B:
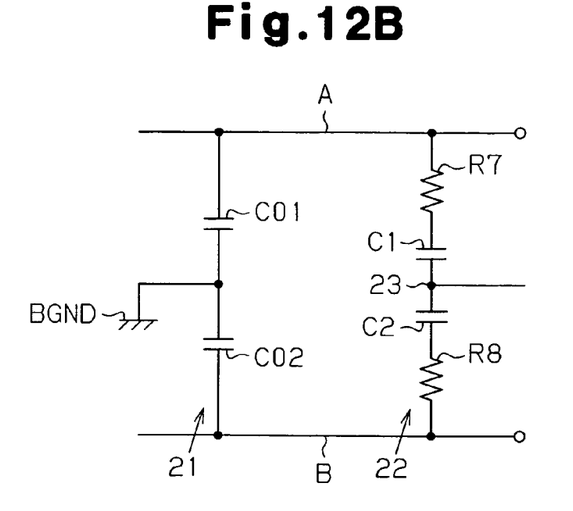

In the first embodiment, the second series circuit 22 having the two capacitors C1, C2 that are connected in series is provided between the AC output lines A, B and the connecting portion of the capacitors C1, C2 is provided with the detecting point 23. In this structure, a resistor R7 and a resistor R8 may be provided between the capacitor C1 and the AC output line A and between the capacitor C2 and the AC output line B, respectively, as illustrated in FIG. 12B. In the fourth embodiment, the second series circuit 26 having the three capacitors C1, C2, C3 that are connected in series is provided between the AC output lines A, B. In this structure, a resistor R7 and a resistor R8 may be provided between the capacitor C1 and the AC output line A and between the capacitor C3 and the AC output line B, respectively. In these cases, the resistors R7, R8 receive most of the voltage supplied to the second series circuit 22, 26. This allows use of smaller-sized capacitors with lower voltage resistance as the capacitors C1, C2, C3. The ground detector 20 thus becomes smaller in size as a whole.

Figure 13A:
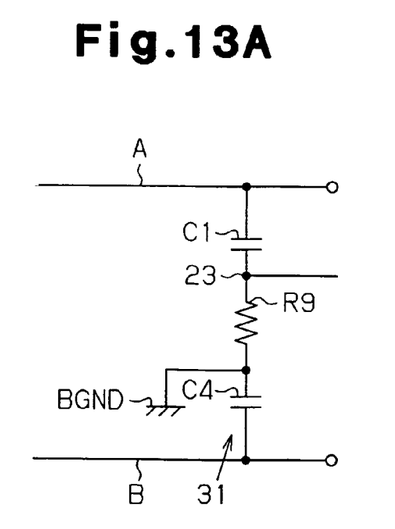
FIGS. 13A and 13B are circuit diagrams representing portions of ground detectors of other different embodiments.

In the sixth and seventh embodiments, the single series circuit including the multiple capacitors is connected to and arranged between the AC output lines A, B. The series circuit includes the two detecting points. However, the series circuit may include only one detecting point. For example, as illustrated in FIG. 13A, a series circuit 31 including two capacitors C1, C4 and a resistor R9 may be connected to and arranged between the AC output lines A, B. Specifically, the capacitor C1, the resistor R9, and the capacitor C4 are connected in series and arranged in this order in the series circuit 31. The connecting portion of the capacitor C1 and the resistor R9 may be connected to the vehicle body ground BGND, while the connecting portion of the capacitor C4 and the resistor R9 is provided with a detecting point 23. Alternatively, the connecting portion of the capacitor C4 and the resistor R9 may be connected to the vehicle body ground BGND, while the connecting portion of the capacitor C1 and the resistor R9 is provided with the detecting point 23. In either case, grounding is easily detected and capacitors with decreased voltage resistance can be used as the capacitors C1, C4.

Figure 13B:
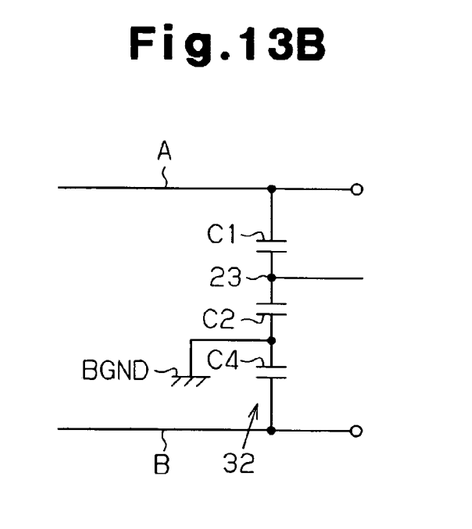

The resistor R9 of FIG. 13A may be replaced by a capacitor, as illustrated in FIG. 13B. Specifically, a single series circuit 32 including three capacitors C1, C2, C4 is connected to and arranged between the AC output lines A, B. One of the connecting portion of the capacitors C1, C2 and the connecting portion of the capacitors C2, C3 is connected to the vehicle body ground BGND while the other connecting portion is provided with the detecting point 23. This structure also allows easy detection of grounding.

A noise filter may be provided in an output portion of the DC-AC inverter 11. The noise filter is formed by coils and a capacitor. The coils are arranged in the corresponding AC output lines A, B. The capacitor is connected to and arranged between the AC output lines A, B at a position downstream from the coils (at a position closer to the AC output). In the ground detector 20 according to the present invention, the multiple capacitors are connected to and arranged between the AC output lines A, B and the connecting portion of an adjacent pair of the capacitors is connected to the vehicle body ground BGND, to form the reference portion for the ground detector 20. For example, two capacitors C01, C02 are connected in series and the connecting portion of the capacitors C01, C02 is connected to the vehicle body ground BGND. Alternatively, three or more capacitors are connected in series and a connecting portion of an adjacent pair of the capacitors is connected to the vehicle body ground BGND. Another connecting portion of another adjacent pair of the capacitors is provided with the detecting point 23. In these cases, the capacitors C01, C02 or the capacitors the connecting portion of which is connected to the vehicle body ground BGND may function also as the capacitors of the noise filter. This reduces the quantity of the capacitors. However, in a series circuit in which a connecting portion of adjacent capacitors is connected to the vehicle body ground BGND and a resistor is provided, the capacitors cannot function as the capacitors of the noise filter. In this case, the noise filter must be installed independently.

In the illustrated embodiments, the capacitors C01, C02 or the capacitors C1, C2, C3, C4 have the equal capacities. However, the capacitors C01, C02 or the capacitors C1, C2, C3, C4 having different capacities may be employed. If the capacitors C01, C02 have different capacities, the reference potential of the output of the detecting point 23 becomes offset from the potential of the vehicle body ground BGND. In the first embodiment, the second series circuit 22 having the two capacitors C1, C2 connected in series is connected to the AC output lines A, B and the connecting portion of the capacitors C1, C2 is provided with the detecting point 23. In this case, the layout of the second series circuit 22 is not influenced by the different capacities of the capacitors C1, C2. However, the layout of a circuit including three or more capacitors becomes complicated if the capacitors have different capacities.

A resistor may be connected to the series circuit 21 in which the capacitors C01, C02 for setting the reference potential are connected in series. This stabilizes the potential of each AC output line A, B with respect to the reference potential, compared to the series circuit 21 solely including the capacitors C01, C02.

Instead of using the comparator 24 with the single positive power supply, the comparator 24 may be employed with a single negative power supply. In this case, the diode D is connected to the comparator 24 in such a manner that the anode, not the cathode, is arranged at the side corresponding to the comparator 24.

In correspondence with an output signal of the detecting point 23, the first detecting point 27a, or the second detecting point 27b, the comparator 24, the upper limit detection comparator 25a, the lower limit detection comparator 25b, the first comparator 28a, or the second comparator 28b generates a high-level signal when grounding is detected and a low-level signal when the grounding is not detected. However, the present invention is not restricted to this. The comparators may generate a low-level signal when grounding is detected and a high-level signal when the grounding is not detected.

Grounding may be detected in correspondence with the output signal of the detecting point 23, the first detecting point 27a, or the second detecting point 27b without employing comparators.

The ground detector 20 does not necessarily have to be used in the DC-AC inverter 11 for vehicles but may be employed in other AC inverters other than those for vehicles.

In the illustrated embodiments, the DC-AC inverter 11 first increases the battery voltage through the DC-DC converter section and then converts the voltage to the AC voltage of 100V or 120V through the DC-AC inverter. However, as long as DC voltage is converted to AC voltage and the AC voltage is output in a state insulated from the DC voltage, the present invention may be applied to any other suitable DC-AC inverters.

The invention claimed is:

1. A ground detector comprising:
   a pair of lines;
   a first series circuit that connects the lines to each other, the first series circuit including a plurality of first capacitors that are connected in series;
   a reference portion, the reference portion being connected to a portion of the first series circuit between two of the first capacitors for DC insulating the lines from the reference portion;
   a second series circuit that connects the lines to each other, the second series circuit including a plurality of second capacitors that are connected in series; and
   a detecting point that is provided in the second series circuit, each of the lines being connected to the detecting point through at least corresponding one of the second capacitors;
   wherein the ground detector detects a change of impedance between the lines and the reference portion based on a change of potential of the detecting point with respect to potential of the reference portion.

2. The ground detector according to claim 1, wherein the first capacitors of the first series circuit are two capacitors that are connected directly to each other, the reference portion being connected to a portion of the first series circuit between the two capacitors.

3. The ground detector according to claim 2, wherein the two capacitors of the first series circuit have equal capacities.

4. The ground detector according to claim 2, wherein each of the two capacitors of the first series circuit functions also as a capacitor for a noise filter.

5. The ground detector according to claim 2, wherein the second capacitors of the second series circuit are two capacitors, the detecting point being provided in a portion of the second series circuit between the two capacitors.

6. The ground detector according to claim 2, wherein the detecting point is a first detecting point, the ground detector further comprising a second detecting point that is provided in the second series circuit, each of the lines being connected to the second detecting point through at least corresponding one of the second capacitors, the second capacitors of the second series circuit being three capacitors, and each of the first and second detecting points being provided in a corresponding one of two portions of the second series circuit, each of which two portions is located between an adjacent pair of the second capacitors.

7. The ground detector according to claim 1 further comprising a comparator, the comparator being connected to the detecting point for receiving an input from the detecting point.

8. The ground detector according to claim 7, wherein the comparator is driven by a positive or negative single power supply, the comparator being connected to the detecting point through a diode for receiving the input from the detecting point through the diode, and the reference portion being connected to a connecting portion of the diode and the detecting point through a resistor.

9. A DC-AC inverter for a vehicle including a ground detector, the ground detector comprising:
   a pair of AC output lines;
   a first series circuit that connects the AC output lines to each other, the first series circuit including a plurality of first capacitors that are connected in series;
   a vehicle body ground, the vehicle body ground being connected to a portion of the first series circuit between two of the first capacitors for DC insulating the AC output lines from the vehicle body ground;
   a second series circuit that connects the lines to each other, the second series circuit including a plurality of second capacitors that are connected in series; and
   a detecting point that is provided in the second series circuit, each of the AC output lines being connected to the detecting point through at least corresponding one of the second capacitors;
   wherein the ground detector detects a change of impedance between the AC output lines and the vehicle body ground based on a change of potential of the detecting point with respect to potential of the vehicle body ground.

10. A ground detector comprising:
    a pair of lines;
    a series circuit that connects the lines to each other, the series circuit including a plurality of capacitors that are connected in series;
    a reference portion, the reference portion being connected to a portion of the series circuit between two of the first capacitors for DC insulating the lines from the reference portion; and
    a detecting point that is provided in the series circuit, each of the lines being connected to the detecting point through at least corresponding one of the capacitors;
    wherein the ground detector detects a change of impedance between the lines and the reference portion based on a change of potential of the detecting point with respect to potential of the reference portion.

11. The ground detector according to claim 10, wherein the series circuit further comprising a resistor provided between the two capacitors and connected in series to the capacitors, the reference portion being connected to a portion of the series circuit between one of the two capacitors and the resistor, and the detecting point being arranged in a portion of the series circuit between the other one of the two capacitors and the resistor.

12. The ground detector according to claim 10, wherein the detecting point is a first detecting point, the ground detector further comprising a second detecting point that is provided in the series circuit, each of the lines being connected to the second detecting point through at least corresponding one of the capacitors, the series circuit further including two resistors arranged between the two capacitors and connected in series to each other and to the capacitors, the reference portion being connected to a portion of the series circuit between the two resistors, and each of the first and second detecting points being provided in a corresponding one of two portions of the series circuit, each of which two portions is located between one of the capacitors and the adjacent one of the resistors.

13. The ground detector according to claim 10 further comprising a comparator, the comparator being connected to the detecting point for receiving an input from the detecting point.

14. The ground detector according to claim 13, wherein the comparator is driven by a positive or negative single power supply, the comparator being connected to the detecting point through a diode for receiving the input from the detecting point through the diode, and the reference portion being connected to a connecting portion of the diode and the detecting point through a resistor.

15. A DC-AC inverter for a vehicle including a ground detector, the ground detector comprising:

a pair of AC output lines;

a series circuit that connects the AC output lines to each other, the series circuit including a plurality of capacitors that are connected in series;

a vehicle body ground, the vehicle body ground being connected to a portion of the series circuit between two of the first capacitors for DC insulating the AC output lines from the vehicle body ground; and a detecting point that is provided in the series circuit, each of the AC output lines being connected to the detecting point through at least corresponding one of the capacitors;

wherein the ground detector detects a change of impedance between the AC output lines and the vehicle body ground based on a change of potential of the detecting point with respect to potential of the vehicle body ground.

* * * * *